United States Patent
Gardner et al.

[11] Patent Number: 5,994,779
[45] Date of Patent: Nov. 30, 1999

[54] SEMICONDUCTOR FABRICATION EMPLOYING A SPACER METALLIZATION TECHNIQUE

[75] Inventors: Mark I. Gardner, Cedar Creek; Daniel Kadosh; Fred N. Hause, both of Austin, all of Tex.

[73] Assignee: Advanced Micro Devices, Inc., Sunnyvale, Calif.

[21] Appl. No.: 08/850,253

[22] Filed: May 2, 1997

[51] Int. Cl.$^6$ .................................................. H01L 23/528
[52] U.S. Cl. ............................................. 257/773; 438/666
[58] Field of Search ............................. 257/773; 438/666

[56] References Cited

U.S. PATENT DOCUMENTS 5,585,307  12/1996  Yoo .......................................... 257/773
5,888,896   3/1999  Givens ..................................... 438/622

*Primary Examiner*—David B. Hardy
*Attorney, Agent, or Firm*—Kevin L. Daffer; Conley, Rose & Tayon

[57] ABSTRACT

An integrated circuit fabrication process is provided in which an interconnect having a least one vertical sidewall surface is formed. The interconnect thusly formed allows for higher packing density within the ensuring integrated circuit since the interconnect requires less space to accommodate the same current density as an interconnect having sloped (i.e., non-vertical) sidewall surfaces. A semiconductor topography is provided which includes transistors arranged upon and within a silicon-based substrate. A first interlevel dielectric is deposited across the semiconductor topography, and portions of the dielectric are removed to form vias to select portions of the transistors. Conductive plugs are formed exclusively within the vias. An insulating material patterned with vertical sidewall surfaces is then formed across the first interlevel dielectric and a portion of the plugs. The insulating material is then patterned. Conductive material is then deposited across the patterned insulating material, the plug upper surfaces, and the first interlevel dielectric. A portion of the conductive material is anisotropically removed to form interconnects which are laterally adjacent to the sidewall surfaces of the insulating material. Each interconnect includes two surfaces, one of which is vertical to the underlying topography and the other of which extends a distance from the fist surface and links with an upper region of the surface in an arcuate pattern. The first lateral surface of the interconnect is directly adjacent to a sidewall surface of the insulating material and is therefore intended to be vertical. The second lateral surface extends a distance from the first lateral surface, constrained the limitations of deposition and not lithography.

11 Claims, 4 Drawing Sheets

SEMICONDUCTOR FABRICATION EMPLOYING A SPACER METALLIZATION TECHNIQUE

BACKGROUND OF THE INVENTION

1. Field of the Invention

This invention relates to integrated circuit fabrication and more particularly to a high density metallization technique employing an interconnect formed laterally adjacent a patterned structure, wherein the resulting interconnect has a vertical sidewall surface.

2. Description of the Relevant Art

Fabrication of an integrated circuit involves numerous processing steps. After impurity regions have been deposited within a semiconductor substrate and gate areas defined upon the substrate, interconnect routing is placed on the semiconductor topography and connected to contact areas thereon to form an integrated circuit. The entire process of making an ohmic contact to the contact areas and routing interconnect material between ohmic contacts is described generally as "metallization". While materials other than metals are often used, the term metallization is generic in its application. It is derived from the origins of interconnect technology, where metals were the first conductors used. As the complexity of integrated circuits has increased, the complexity of the metallization structure has also increased.

In general, the formation of interconnect routing between ohmic contacts first involves depositing a conductive material across the surface of a semiconductor topography embodying ohmic contact areas. Interconnects may need to extend relatively long distances across an integrated circuit to reach contacts. Therefore, it is popular to use a conductive material which exhibits low resistivity, such as aluminum or aluminum alloy. A photolithographic pattern consisting partially of stripes is formed upon the conductive material. An optical image and a photosensitive film are used to produce the interconnect pattern. The photosensitive film (i.e., photoresist) has two main properties: when exposed to appropriate radiation, resist solubility is altered, allowing certain areas to be easily washed away by a solvent; and when exposed to an etchant capable of removing the conductive material, it resists attack. Thus, to complete the formation of interconnect, areas of the conductive material not covered by photoresist are etched away using an etchant that exclusively attacks those areas.

A problem with the above-mentioned method for the formation of interconnect is that etching results in interconnects having sloped sidewall surfaces. Sloped sidewall surfaces particularly result when using isotropic etching which occurs laterally and obliquely at a relatively uniform rate in all directions. Thus, anisotropic etching has become popular in integrated circuit manufacturing because it allows the downward etch rate to be much larger than the lateral etch rate, resulting in less sloping of interconnect sidewall surfaces. However, even with the advent of anisotropic etch technology, sidewall surfaces of interconnect still exhibit an undesired amount of sloping (i.e., is not substantially vertical to the underlying topography surface).

Turning to FIG. 1a, a cross-sectional view of interconnect 10 is shown patterned upon a relatively planar topography 14. Patterned interconnect 10 results from conventional etchant as having such a sloped sidewall surface 16. A patterned photoresist layer 12 is shown lying directly above interconnect 10 being formed. Unfortunately, during etching, the top portion of interconnect 10 under photoresist layer 12 is oftentimes removed somewhat. Removal at the upper portion occurs at a faster rate than the bottom portion, most likely due to the isotropic component of conventional etchants. The result of such etching is that the base of interconnect 10 is be wider than its upper surface. This result is sometimes referred to as "undercutting". A detailed view of sidewall surface 16 is illustrated in FIG. 1b. The resulting sidewall surface 16 is shown non-perpendicular to the horizontal topography 14 upon which interconnect line 10 is disposed. Therefore, an angle 20 between sidewall surface 16 and surface 14 is less than ninety degrees. Dashed line 18 represents an ideal sidewall surface as being vertical.

Current density is dependent on the actual cross-sectional area of an interconnect line. The cross-sectional area of an interconnect must be large enough to accommodate a predetermined current density. Thus, since conventional interconnect are wider at the bottom than at the top (e.g. interconnect 10 of FIG. 1a), the interconnect requires more space than it would if it had vertical sidewall surfaces. The packing density of an integrated circuit is therefore sacrificed by the sloped sidewall surfaces of interconnects. The amount of interconnect routing across a single horizontal level of an integrated circuit could be increased by the development of interconnect having vertical sidewall surfaces or, at the very least, more controlled placement of sidewall surfaces relative to one another. Packing density limitations further limit operation speed and circuit complexity. It is therefore desirable that a semiconductor fabrication process be developed for the formation of interconnect which allows higher density layout of advanced ULSI integrated circuits.

SUMMARY OF THE INVENTION

The problems outlined above are in large part solved by the fabrication process of the present invention. That is, a method for forming interconnect is provided which promotes high packing density of interconnect routing within an integrated circuit. The interconnect preferably consists of a conductive material defined between two opposite lateral sidewall surfaces. At least one of the sidewall surfaces of the interconnect is preferably vertical. Therefore, the interconnect can occupy a minimum amount of space while providing current density comparable to interconnect which occupy more space. The interconnect frees more lateral area for routing of more metal lines across one or more elevational planes of the integrated circuit.

According to one embodiment, a semiconductor substrate is provided on which a first interlevel dielectric is deposited. This semiconductor substrate may comprise transistors laterally spaced apart. Conductive plugs may be formed through the first interlevel dielectric to the transistors. A material having properties conducive to vertical sidewall formation when undergoing partial removal is then formed across the first interlevel dielectric. This material may be a sacrificial material. The sacrificial material is preferably an insulating material, such as photoresist, silicon dioxide, or silicon nitride. A portion of the sacrificial material may then be removed, exposing certain areas of the first interlevel dielectric and forming at least one sidewall surface of the sacrificial material. This sidewall surface which previously abutted the sacrificial material is preferably perpendicular to the first interlevel dielectric upper surface. The purpose of the sacrificial material is to provide a vertical sidewall surface that an interconnect surface can be formed directly adjacent to, whereby the interconnect sidewall surface which retain the vertical surface of sacrificial material.

A conductive material is deposited across the sacrificial material and the exposed portions of the first interlevel dielectric, such that a portion of the conductive material contacts sidewall surfaces of the sacrificial material. Portions of the conductive material are then removed using anisotropic etch to form interconnects spaced across the upper surface of the first interlevel dielectric. These interconnects are formed laterally adjacent to the sidewalls of the sacrificial material, and at least one interconnect contacts a plug in the first interlevel dielectric. Each interconnect has a pair of opposite lateral surfaces. The first lateral surface abuts the sidewall surface of the sacrificial material while the second lateral surface is a pre-defined lateral distance from the first lateral surface. Anisotropic removal of the conductive material further leads to the formation of an upper surface for each interconnect, wherein the interconnect upper surface is at substantially the same elevational level as an upper surface of the sacrificial material. The first lateral surface is preferably perpendicular to the surface of the first interlevel dielectric since it is formed against a vertical sidewall surface of the sacrificial material. Moreover, the second lateral surface forms an arcuate pattern from an upper, lateral corner of the patterned sacrificial material to a region laterally spaced from the first lateral surface.

After the interconnects have been formed, the sacrificial material may have to be removed, depending on its material. For example, if the sacrificial material is photoresist, which readily absorbs water, the photoresist is stripped in order to prevent shorting caused by the presence of water within the integrated circuit. A second interlevel dielectric may then be deposited across the interconnects and the first interlevel dielectric. Other interconnects may be formed upon the second interlevel dielectric. These interconnects may be electrically coupled to the previously formed interconnects by plug formation in the second interlevel dielectric, resulting in a multi-level integrated circuit.

The present invention exhibits advantageous features compared to conventional methods of semiconductor fabrication. A method is provided for forming interconnect having at least one vertical sidewall surface. The formation of such interconnect allows for higher packing density within an integrated circuit employing the interconnect since the interconnect requires less space to accommodate the same current density as conventional interconnects having sloped sidewall surfaces. Therefore, more interconnects can occupy a specific area of an integrated circuit. Thus, the present interconnect promotes high packing density of interconnect routing across a level of a multi-level integrated circuit. Furthermore, the combination of several highly packed interconnect levels leads to high packing density of an entire integrated circuit.

BRIEF DESCRIPTION OF THE DRAWINGS

Other objects and advantages of the invention will become apparent upon reading the following detailed description and upon reference to the accompanying drawings in which:

FIG. 1b is a detailed view along section 1b of FIG. 1a.

Figure 1A:
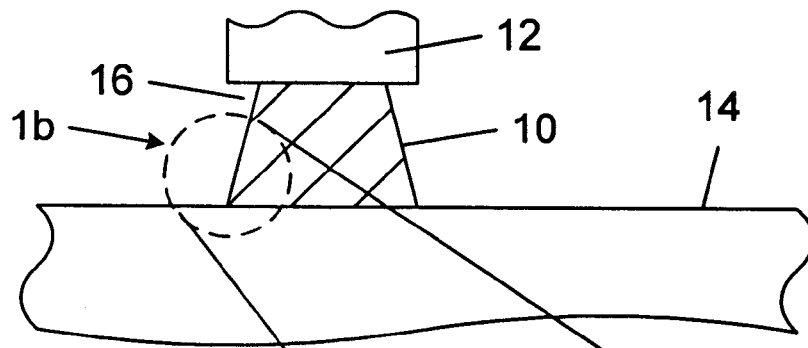
FIG. 1a is a cross-sectional view of an interconnect conventionally formed with sloped sidewall surfaces.
Figure 1B:
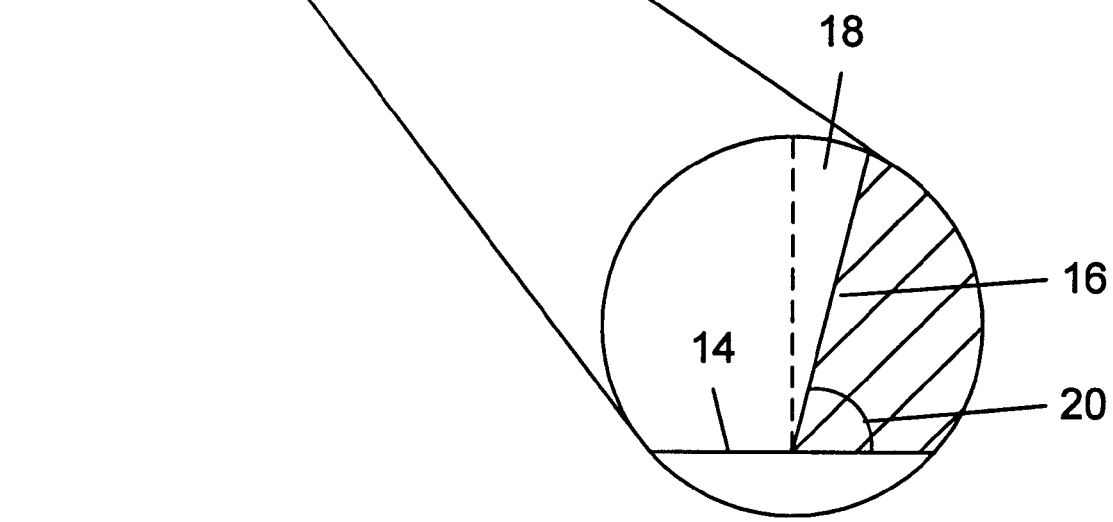

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
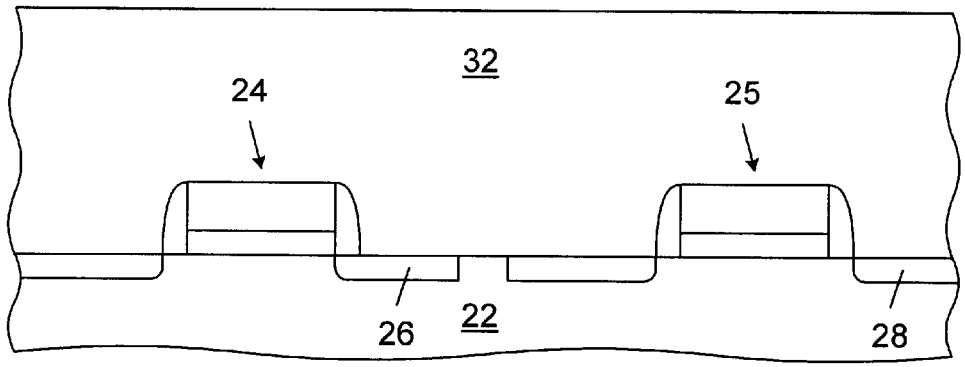
FIG. 2 is a cross-sectional view of a semiconductor topography embodying a pair of transistors laterally spaced from one another, wherein an interlevel dielectric is deposited across the semiconductor topography.

Turning to FIG. 2, a semiconductor topography 22 is depicted in which a transistor 24 is laterally spaced from another transistor 25. Both of these transistors preferably have polysilicon gate conductors. Semiconductor topography 22 may include a single crystalline silicon substrate. Transistor 24 preferably includes a source or drain region, i.e., junction 26, formed by doping a region of the silicon-based substrate laterally displaced from another junction by the gate conductor. Transistor 25 also includes a junction 28. Deposited upon topography 22 is a PMD (polysilicon-to-metal dielectric) used between the polysilicon gate conductor, or other local-interconnect level material, and a metal interconnect layer. Interlevel dielectric 32 is composed of silicon dioxide but may comprise other insulating materials as well. Various methods may be used to form interlevel dielectric 32, including deposition of an oxide- or glass-based material.

Figure 3:
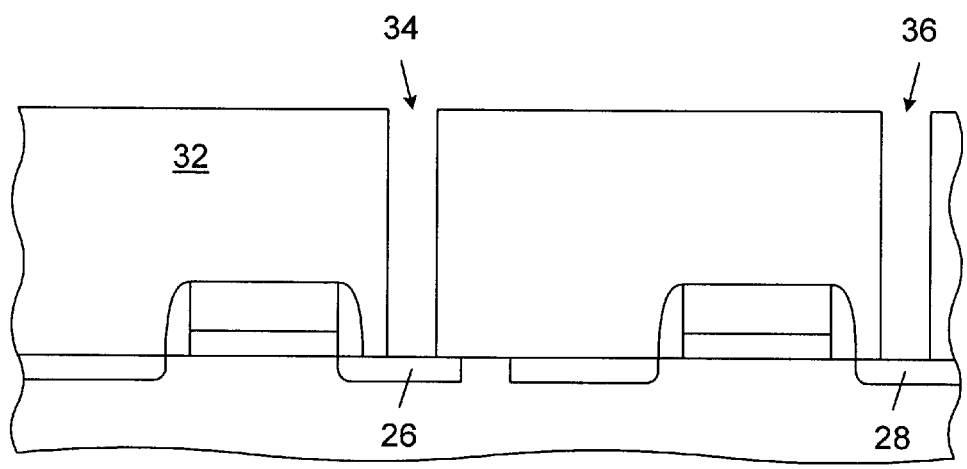
FIG. 3 is a cross-sectional view of the semiconductor topography, wherein portions of the interlevel dielectric is removed to form vias extending to portions of the transistors, subsequent to the step in FIG. 2.
Figure 4:
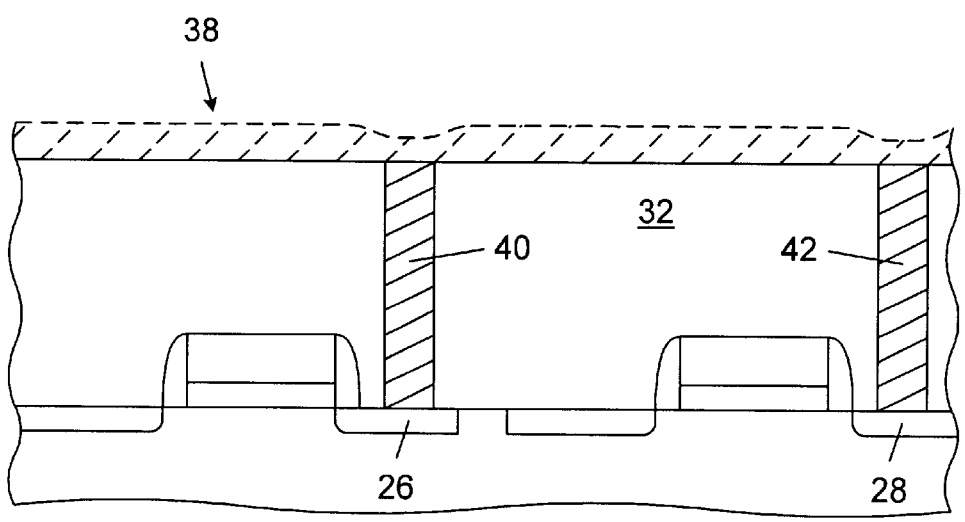
FIG. 4 is a cross-sectional view of the semiconductor topography, wherein a conductive material is arranged exclusively within the vias to form plugs therein, subsequent to the step in FIG. 3.

As depicted in FIG. 3, a first via 34 and a second via 36 are formed entirely through interlevel dielectric 32 by selectively etching a portion of interlevel dielectric 32. Via 34 may extend vertically to junction 26, and via 36 may extend vertically to junction 28. Vias 34 and 36 are formed by etching away areas of interlevel dielectric 32 not covered by a patterned masking layer (formed using photolithography). The patterned masking layer (not shown) selectively exposes an upper surface of interlevel dielectric 32. The etch process involves either a wet chemical etch or a dry, plasma etch in which the etch is highly selective to removing the interlevel dielectric but not the underlying silicon substrate (i.e., doped junction areas 26 and 28). Alternatively, the etch duration may be timed to terminate a defined distance into interlevel dielectric 32, before etching the topography below the interlevel dielectric. FIG. 4 depicts formation of conductive plugs 40 and 42 bounded exclusively within vias 34 and 36 (shown in FIG. 3), respectively. To form plugs 40 and 42, a conductive material, e.g., tungsten, is blanket deposited into vias 34 and 36 and across interlevel dielectric 32. An undesired portion 38 of the conductive material is then removed using, e.g., selective etching or CMP. Portion 38 is cleared from the upper surface of interlevel dielectric 32, leaving plugs 40 and 42 having an upper surface substantially equal to the elevation of dielectric 32 upper surface.

Figure 5:
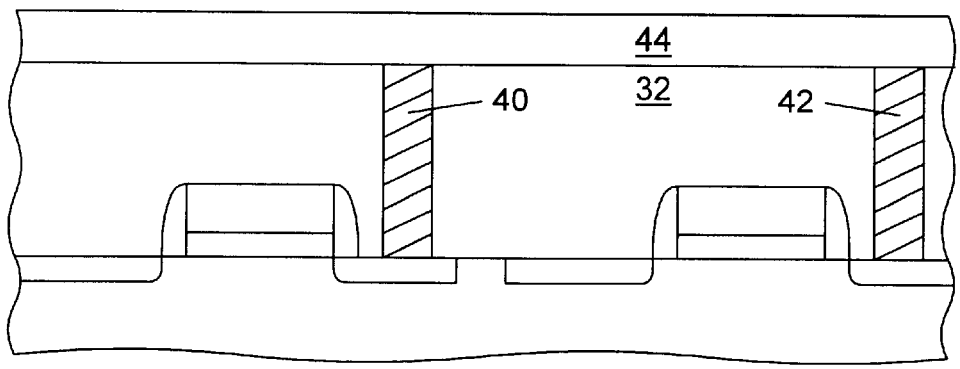
FIG. 5 is a cross-sectional view of the semiconductor topography, wherein a sacrificial material is preferably formed across the interlevel dielectric and the plugs, subsequent to the step in FIG. 4.

Turning to FIG. 5, a material 44 is then formed across interlevel dielectric 32 and plugs 40 and 42. Material 44 may be deemed a sacrificial material, however, it need not be one which is necessary sacrificial. Material 44 may be chosen to be entirely removed at a later time if desired. However, it is understood that, depending on the composition of material 44, that it need not be removed in all instances. Material 44 is an insulting material that can be patterned to form relatively vertical sidewall surfaces of the sacrificial material. Examples of materials which may be used are photoresist, silicon dioxide, silicon nitride, or various silicates. Both silicon dioxide and silicon nitride may be deposited by chemical vapor deposition. Silicon dioxide and silicon nitride may be patterned by etching away areas thereof not protected by a photoresist making layer and then stripping away the masking layer. CVD silicon dioxide works well as a sacrificial material because it exhibits good dielectric properties and physical properties which allow it to be deposited at temperatures compatible with the presence of aluminum on a wafer. The thickness of the sacrificial material need not be as large as that of interlevel dielectric 32. Thus, it is also possible to use PECVD silicon nitride of silicate as the sacrificial material even though silicon nitride possesses a higher dielectric constant than CVD silicon dioxide.

Material 44 is henceforth defined as a sacrificial material for sake only of a name. It is believed necessary to remove sacrificial material 44 at a later time if it demonstrates poor dielectric properties or can retain moisture—i.e., is hygroscopic. Sacrificial material 44 need not be removed if it is has a high dielectric constant commensurate with the interlevel dielectric. Thus, sacrificial material 44 is as one that can be removed or retained.

Regardless of the material chosen to represent sacrificial material 44, the material must be one that exhibits propensity to etch relative to a metal material. More specifically, material 44 must demonstrate a vertical sidewall surface when selectively patterned, and the vertical sidewall so developed must be one that, relatively speaking, is more vertical than if metal were patterned. An anisotropic (dry) etch is preferably used to pattern material 44 and produce the desired sidewall surface. Material 44 is chosen such that is responds well to ion assisted etch, leaving a vertical surface arranged along the direction in which the ions are channeled. Any of the various oxides, nitrides, glasses, and/or silicates are believed receptive to such etchants, resulting in a relatively vertical sidewall surface.

Figure 6:
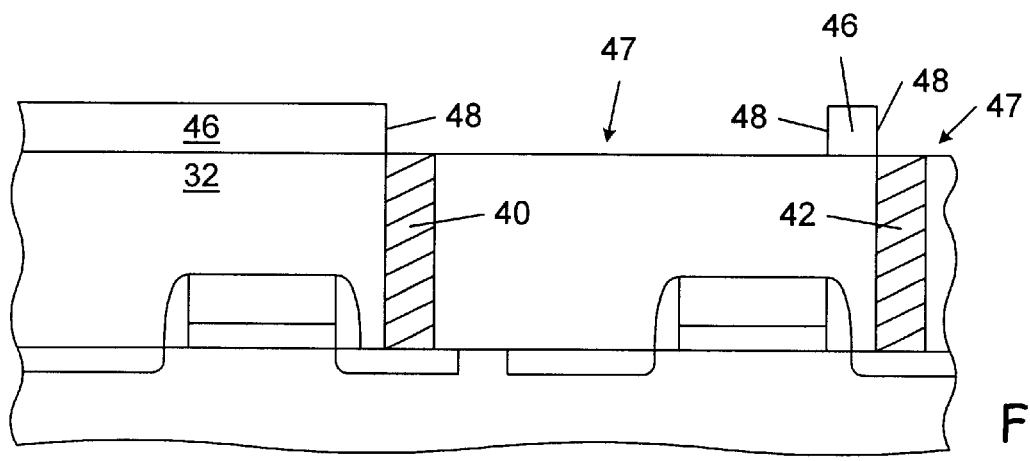
FIG. 6 is a cross-sectional view of the semiconductor topography, wherein portions of the sacrificial material are selectively removed to expose the plugs and regions of the interlevel dielectric and to form vertical sidewall surfaces of the sacrificial material, subsequent to the step in FIG. 5.
Figure 7:
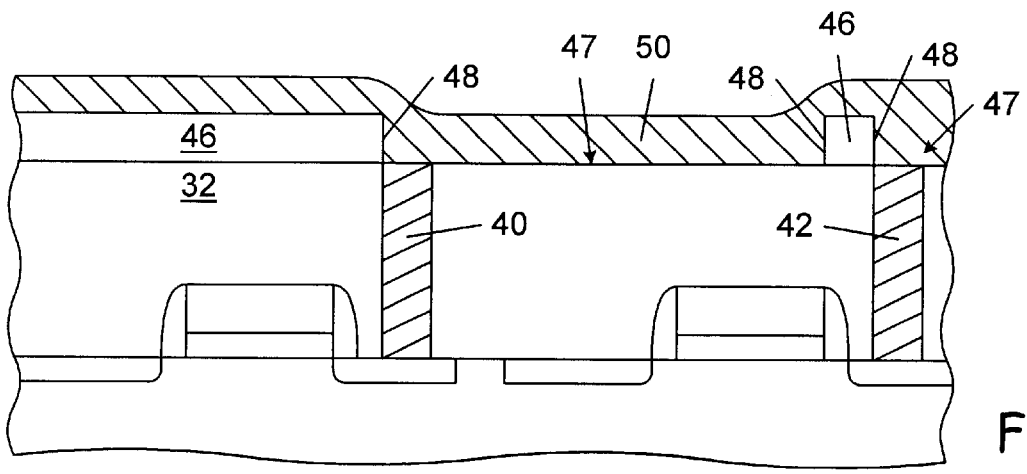
FIG. 7 is a cross-sectional view of the semiconductor topography, wherein a conductive material is deposited across the patterned sacrificial material, the exposed plugs, and the exposed regions of the interlevel dielectric, subsequent to the step in FIG. 6.

FIG. 6 illustrates patterning of sacrificial material 46, as described above. The removal of a portion of sacrificial material 46 exposes the upper surface 47 of interlevel dielectric 32, and exposes plugs 40 and 42. The sacrificial material remaining after being patterned contains sidewall surfaces 48 which are relatively perpendicular to upper surface 47, more so than sidewall surfaces of an interconnect patterned from a metal layer. Once patterned, sidewall surfaces 48 remain perpendicular to the plane formed by upper surface 47. As depicted in FIG. 7, an interconnect material 50, e.g., aluminum, may be blanket deposited across sacrificial material 46 and upper surface 47 such that interconnect material 50 abuts sidewall surfaces 48. Deposition duration of interconnect material 50 is chosen to terminate when its thickness extending above upper surface 47 reaches the thickness of sacrificial material 46.

Figure 8:
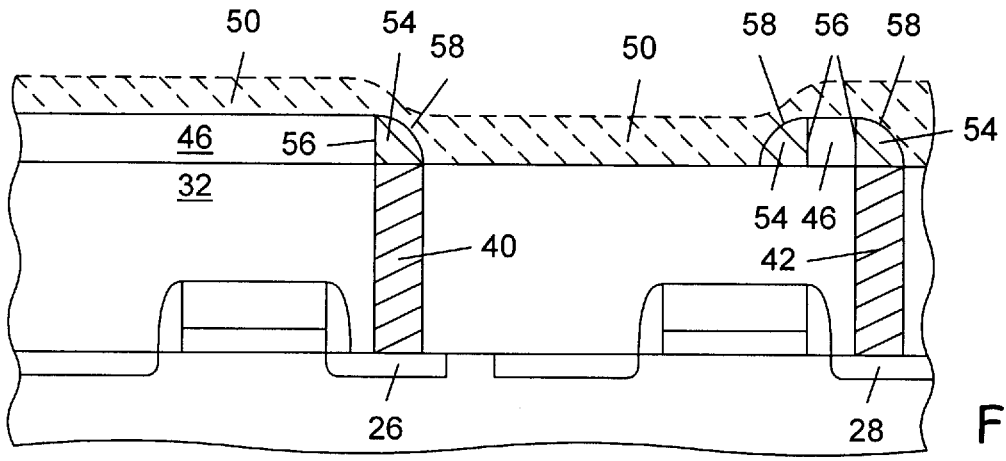
FIG. 8 is a cross-sectional view of the semiconductor topography, wherein a portion of the conductive material is removed to pattern interconnects laterally adjacent to the sidewall surfaces of the patterned sacrificial material, subsequent to the step in FIG. 7.

FIG. 8 depicts removing a portion of interconnect material 50. Removal involves anisotropically etching away the interconnect material 50. A blanket anisotropic etch is preferably used, whereby ions are directed perpendicular to the topological surface thus clearing material 50 from all horizontal surfaces. Blanket etch implies application of etchant across the entire surface occupied by material 50. Interconnect material located above sacrificial material 46 as well as interconnect material located above interlevel dielectric 32 horizontal surfaces are removed. What remains are interconnects 54 arranged immediately adjacent only the sidewall surfaces 48 of patterned material 44. An interconnect 54 preferably contacts at least a portion of select plugs 40 and 42. Plugs 40 and 42 may therefore provide electrical coupling between junction 26 and one interconnect 54 and between junction 28 and another interconnect 54.

Anisotropic etch does not remove material 50 immediately adjacent sidewall surfaces 48 (the retained portion of material 50 denoted as reference numeral 54). The retained portions 54 are believed to exist due, in part, to the "shadowing effect" brought about by the vertical surface 48 relative to the ion-assisted bombardment or etchant solution. Surface 48 extends within portions 54 a relatively small lateral distance away from the vertical edge of surface 48.

The retained portions 54 form a relatively narrow interconnect 54 having two closely spaced, opposing lateral surfaces defined as a first lateral surface 56 and second lateral surface 58. First lateral surface 56 is located immediately adjacent sidewall surface 48. Since first lateral surface 56 is defined by sidewall surface 48, surface 56 must also be substantially perpendicular to the upper surface of interlevel dielectric 32. However, since second lateral surface 58 is formed by anisotropic etch, it presents an arcuate shape. The anisotropic etch duration is selected so that the upper surface of each interconnect 54 is at or slightly below the upper surface of sacrificial material 46 (i.e., interconnect 54 upper surface is equal in elevation or below the elevation of material 46).

Figure 9A:
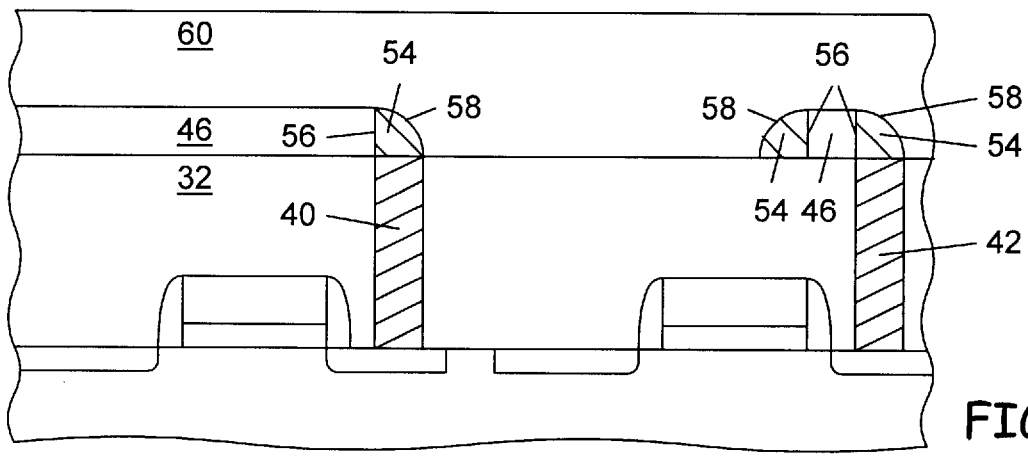
FIG. 9a is a cross-sectional view of the semiconductor topography wherein, according to one embodiment, another interlevel dielectric is deposited across the patterned sacrificial material, the interconnects, and the underlying interlevel dielectric, subsequent to the step in FIG. 8.
Figure 9B:
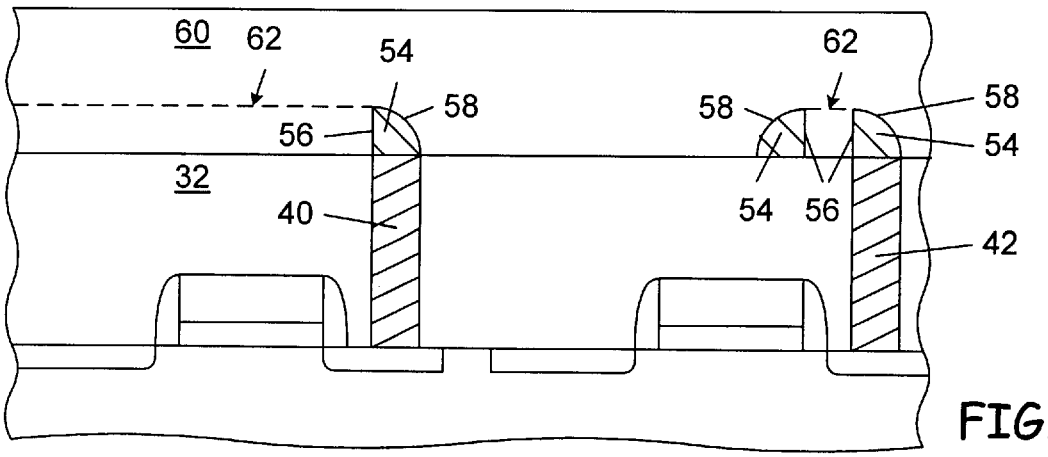
FIG. 9b is a cross-sectional view of the semiconductor topography wherein, according to another embodiment, the patterned sacrificial material is removed prior to depositing another interlevel dielectric across the interconnects and the underlying interlevel dielectric, subsequent to the step in FIG. 8.

FIG. 9a illustrates a second interlevel dielectric 60 configured between a first level of interconnect (i.e., interconnect 54) and a second level of interconnect (not shown). Interlevel dielectric 60 is deposited across sacrificial material 46, interconnect 54, and interlevel dielectric 32, according to one embodiment. FIG. 9b depicts another embodiment in which sacrificial material 46 is removed, as indicated by dashed line 62, before depositing interlevel dielectric 60. This removal of sacrificial material 46 is necessary if the material is composed of, e.g., photoresist, which is naturally hygroscopic. Various methods may be used to strip away photoresist. Dry etching, i.e., using oxygen plasmas in plasma etching equipment, is preferred since it offers several advantages over wet resist strippers. Some of these advantages are safer operating conditions, no metal ion contamination, reduced pollution problems, and no attack of most underlying substrate materials. Wet etch solution may be used, however, for the benefit of their high selectivity to photoresist and not the underlying oxide or adjacent metal interconnect. More interconnects (i.e. second metal layer) may further be formed upon interlevel dielectric 60 in the same manner as those interconnects 54 (i.e. first metal layer) are formed upon interlevel dielectric 32.

Of benefit is the formation of a relatively narrow interconnect 54. Interconnect 54 can be formed having a width (i.e., space between opposing lateral surfaces) of less than, for example, 1.0 micron. Reduced width is achieved using deposition of interconnect material rather than removing portions of an interconnect layer. Accordingly, the present process is deemed an additive process rather than a subtractive one (i.e., rather than blanket deposition of a layer followed by selective removal). Additive placement of interconnect 54 involves fewer steps and is not constrained by lithographic limitations on opposed lateral interconnect surfaces typically imposed with subtractive placement. Moreover, subtractive placement is limited by photolithography and, more specifically, to the depth of focus during exposure and therefore the planar disparity of the topography on which the interconnect is being patterned.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the form of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description. Changes may be made in the elements described herein without departing from the spirit and scope of the invention as described in the following claims.

What is claimed is:

1. An integrated circuit, comprising an interconnect having conductive material defined between opposed first and second lateral surfaces, wherein said interconnect is located upon an interlevel dielectric, wherein said first surface is substantially perpendicular to a planar upper surface of said interlevel dielectric, and wherein said second surface substantially arcs from said upper surface of said interlevel dielectric to an upper surface of said interconnect.

2. The integrated circuit of claim 1, wherein said conductive material comprises aluminum.

3. The integrated circuit of claim 1, wherein a width between said first and second lateral surfaces is less than approximately 1.0 micron.

4. The integrated circuit of claim 1, further comprising a conductive plug formed within said interlevel dielectric below said interconnect.

5. An integrated circuit, comprising an interconnect having conductive material defined between opposed first and second lateral surfaces, wherein said interconnect is located upon an interlevel dielectric, wherein said first surface is substantially perpendicular to a planar upper surface of said interlevel dielectric and is placed adjacent and immediately lateral to a patterned layer, and wherein said second surface substantially arcs from said upper surface of said interlevel dielectric to an upper surface of said interconnect.

6. The integrated circuit as recited in claim 5, wherein said patterned layer comprises photoresist.

7. The integrated circuit as recited in claim 5, wherein said patterned layer comprises silicon dioxide.

8. The integrated circuit as recited in claim 5, wherein said patterned layer comprises silicon nitride.

9. The integrated circuit of claim 5, wherein said conductive material comprises aluminum.

10. The integrated circuit of claim 5, wherein a width between said first and second lateral surfaces is less than approximately 1.0 micron.

11. The integrated circuit of claim 5, further comprising a conductive plug formed within said interlevel dielectric below said interconnect.

\* \* \* \* \*